(12) United States Patent
Kumabe et al.

(10) Patent No.: US 6,499,811 B2
(45) Date of Patent: Dec. 31, 2002

(54) INTEGRATED CIRCUIT HAVING POWER SUPPLY VOLTAGE MONITOR

(75) Inventors: Hajime Kumabe, Kariya (JP); Hideki Kabune, Chiryu (JP); Hiroyasu Kidokoro, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/824,727

(22) Filed: Apr. 4, 2001

(65) Prior Publication Data

US 2001/0035682 A1 Nov. 1, 2001

(30) Foreign Application Priority Data

Apr. 28, 2000 (JP) ........................................ 2000-130812

(51) Int. Cl.$^7$ ............................................... B60T 8/00
(52) U.S. Cl. ........................................................ 303/20
(58) Field of Search ................................. 303/3, 15, 20; 188/181 C; 327/110; 307/10.1

(56) References Cited

U.S. PATENT DOCUMENTS

| | | | | |
|---|---|---|---|---|
| 5,193,887 A | * | 3/1993 | Bleckmann et al. | 188/181 C |
| 5,372,410 A | * | 12/1994 | Miller et al. | 303/20 |
| 5,729,164 A | * | 3/1998 | Pattantyus | 327/110 |
| 5,744,874 A | * | 4/1998 | Yoshida et al. | 307/10.1 |
| 5,945,743 A | * | 8/1999 | Pattantyus et al. | 307/10.1 |
| 6,115,831 A | * | 9/2000 | Hanf et al. | 714/43 |

* cited by examiner

*Primary Examiner*—Christopher P. Schwartz
(74) *Attorney, Agent, or Firm*—Law Offices of David G. Posz

(57) ABSTRACT

In an ABS control ECU, a power supply output circuit and a power supply monitoring unit are formed on the same chip. A power, supply terminal for the power supply output circuit is provided separately from a power supply terminal for the power supply monitoring unit. A ground terminal for the power supply output circuit is provided separately from a ground terminal for the power supply monitoring unit.

17 Claims, 5 Drawing Sheets

INTEGRATED CIRCUIT HAVING POWER SUPPLY VOLTAGE MONITOR

CROSS REFERENCE TO RELATED APPLICATION

This application is based on and incorporates herein by reference Japanese Patent Application No. 2000-130812 filed Apr. 28, 2000.

BACKGROUND OF THE INVENTION

The present invention relates to an integrated circuit for monitoring a power supply voltage, and particularly to an integrated circuit suitably used for an electronic control unit for vehicle brake control.

An electronic control unit (ECU) has a power output circuit which is monitored and a power supply monitoring unit. which monitors a power output. The power supply voltage is supplied to a plurality of circuit blocks within the ECU having the power output circuit and the power supply monitoring unit monitors whether an output Voltage of the power output circuit is set to a predetermined voltage value or not.

The power output circuit and power supply monitoring unit are connected to an external power supply via only one power supply terminal provided in the ECU. The power output circuit generates, on the basis of a voltage applied to the power supply terminal, a reference voltage supplied to a plurality of circuit blocks and a reference voltage used by the power supply monitoring unit to monitor the output voltage of the power output circuit.

However, the power output circuit and the power supply monitoring unit are provided on different chips, resulting in an increased manufacturing cost of the electronic control unit and an enlarged installation area of the ECU.

SUMMARY OF THE INVENTION

It is therefore an object of the present invention to provide an integrated circuit for monitoring an output voltage of a power output circuit with only one chip.

According to the present invention, an electronic control unit for a vehicle such as an ABS control ECU includes an integrated circuit, which comprises a monitored block for supplying a power supply voltage to other circuits and a monitoring block for monitoring the monitored block. The monitoring block and the monitored block are formed on the same chip. Further, power supply terminals for supplying voltages to the monitored block and the monitoring block are provided as different terminals. Ground terminals for the monitored block and the monitoring block are also provided as different terminals.

Preferably, the monitored block and the monitoring block are arranged as spatially separated blocks in the same chip. The monitored block and the monitoring block are insulated and isolated in the same chip. The monitored block and the monitoring block are, formed on a SOI substrate, and the monitored block and the monitoring block are insulated and isolated with a trench formed on the SOI substrate. Reference voltage generating circuits of the monitored block and the monitoring block are formed in different circuit configurations from each other.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described in detail with, reference to an embodiment, which is directed to an electronic control unit (ECU) for an anti-lock brake system (ABS).

Figure 1:
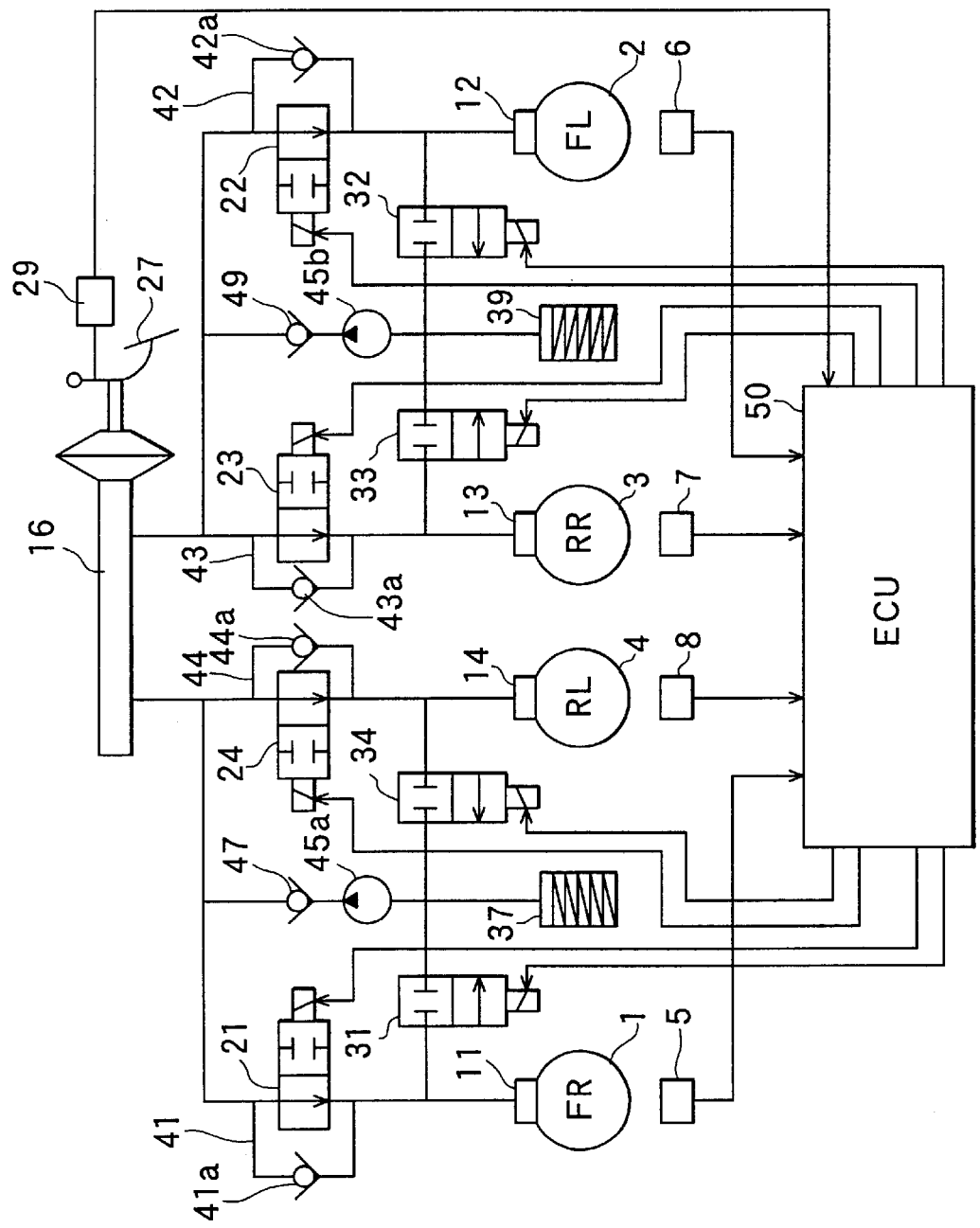
FIG. 1 is a schematic diagram illustrating an ABS control system to which an ABS control ECU is applied as an integrated circuit according to a first embodiment of the present invention.

Referring first to FIG. 1 showing an ABS control system, a front-right (FR) wheel 1, a front-left (FL) wheel 2, a rear-right (RR) wheel 4 and a rear-left (RL) wheel 4 are provided with an electromagnetic pickup type, a magneto-resistive effect device (MRE) type or a Hall device type wheel speed sensors 5 to 8, respectively. These wheel speed sensors 5 to 8 generate respective pulse signals depending on rotation of the wheels 1 to 4.

Moreover, the wheels 1 to 4 are respectively provided with wheel cylinders 11 to 14. When a master cylinder 16 generates a brake fluid pressure depending on the driver's stepping-on amount of a brake pedal 27, this brake fluid pressure is transferred to the wheel cylinders 11 to 14 via dual-position valves (pressure increase control valves) 21 to 24 and through respective fluid pressure piping. The stepping-on condition of the brake pedal 27 is detected by a stop switch 29.

Moreover, the wheel cylinders 11, 14 are connected with a reservoir 37 via dual-position valves (pressure decrease control valves) 31, 34, respectively. The wheel cylinders 12, 13 are connected with a reservoir 39 via dual-position valves (pressure decrease control valves) 32, 33, respectively.

The dual-position valves 21 to 24 and 31 to 34 are each comprised of a solenoid drive type dual-position valve including a communication position and a shut-off position. These communication position and shut-off position can be switched by supplying electric power to the solenoid.

On the other hand, the upstream and downstream of the dual-position valves 21 to 24 are connected with bypass piping 41 to 44, respectively. These bypass piping 41 to 44 are provided with non-return valves 41a to 44a, respectively. Only the fluid pressure toward the master cylinder 16 from the wheel cylinders 11 to 14 flows through the bypass piping 41 to 44.

The reservoirs 37, 39 are connected with a fluid pressure piping via pumps 45a, 45b driven by motors not illustrated and non-return valves 47, 49, respectively. Only the fluid pressure toward the master cylinder 16 from the reservoirs 37, 39 is allowed to flow.

Detection signals of the wheel speed sensors 5 to 8 and stop switch 29 are inputted to an ECU 50 for ABS control. The ABS control ECU 50 generates, based on the above detection signals, control signals for the dual-position valves 21 to 24 and 31 to 34 and motor control signals to drive the pumps 45*a*, 45*b* on the basis of these control signals, the dual-position valves 21 to 24 and 31 to 34 and motor are controlled for the purpose of ABS control or the like.

Figure 2:
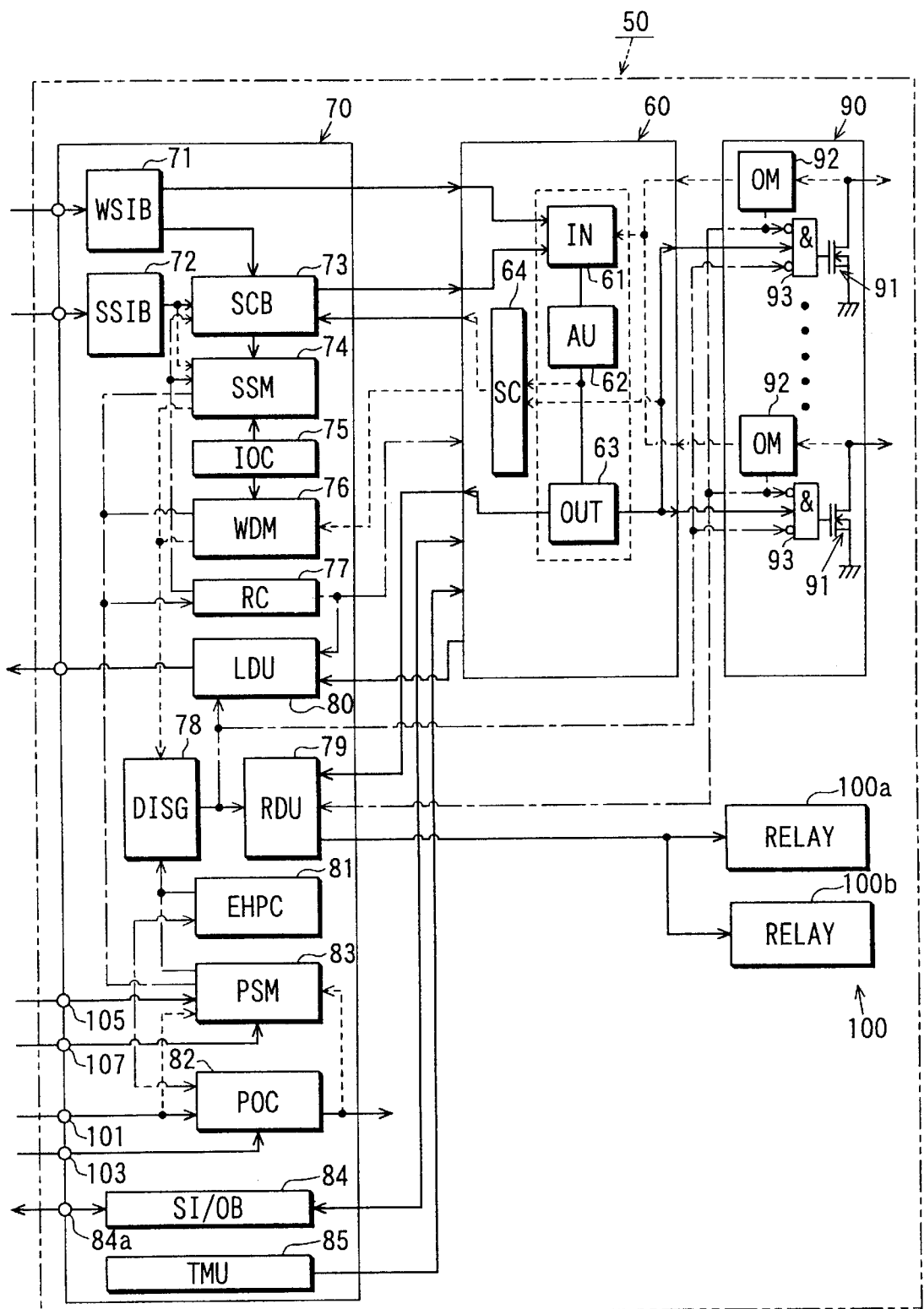
FIG. 2 is a block diagram of the ABS control ECU shown in FIG. 1.

FIG. 2 illustrates a block diagram illustrating the internal structure of the ABS control ECU 50,. As illustrated in this figure, the ABS control ECU 50 has a plurality of chips including a microcomputer 60, a peripheral IC 70, a solenoid driver 90 and a semiconductor relay 100 or the like.

Details of each structural device of the ABS control ECU 50 will then be described. Each arrow mark in a solid line in FIG. 2 indicates a control system line, each arrow mark in a broken line indicates a monitor system line, and each arrow mark in a chain line indicates an inhibit/shut-off system line. The control system line means that a device at the front end of the arrow mark is controlled based on a signal from a device at the rear end of the arrow mark. Moreover, the monitor system line means that a device at the front end of the arrow mark monitors whether a specified device fails or not based on a signal from a device at the rear end of the arrow mark. Moreover, the inhibit/shut-off system line means that a device at the front end of the arrow mark inhibits or shuts off a drive of a specified device based on an inhibit/shut-off signal from a device at the rear end of the arrow mark.

First, the microcomputer 60 comprises an input unit 61, an arithmetic unit 62, an output unit 63. When various information pieces such as the wheel speed signals are inputted to the input unit 61, the arithmetic unit 62 performs various arithmetic operations used for ABS control based on such various information inputs. The output unit 63 generates ABS control signals, that is, solenoid drive signals and motor drive signals based on the arithmetic operation Moreover, the microcomputer 60 is also provided with a serial communication unit 64. When various signals produced in the arithmetic operation of the arithmetic unit 62 (for example, ABS control signal indicating the ABS control condition) are inputted, these various signals are converted to a serial signal and then sent to the peripheral IC 70 as the serial signal.

Next, the peripheral IC 70 comprises a wheel speed input buffer 71, a switch (SW) signal input buffer 72, a serial communication buffer 73, a serial communication monitoring unit 74, an internal oscillator circuit 75, a watch-dog (WD) monitoring unit 76, a reset control unit 77, a drive inhibit signal generating unit 78, a relay drive unit 79, a lamp drive circuit 80, an excessive-heating protection circuit 81, a power supply monitoring unit 82, a power supply output circuit 83, a signal input/output buffer 84 and a temperature monitoring unit 85. Each device circuit or unit is integrated into one chip to form the peripheral IC 70.

The wheel speed input buffer 71 performs waveform shaping to correct the detection signals transmitted from the wheel speed sensors 5 to 8 of FIG. 1 into a rectangular shape. The wheel speed signal shaped in the waveform by this wheel speed input buffer 71 is then inputted to the microcomputer 60 for various arithmetic operations of wheel speeds and estimated body speed used for ABS control. Moreover, the wheel speed input buffer 71 also detects a breakage of wire connecting the wheel speed sensors 5 to 8 and the ABS control ECU 50. This buffer 71 transmits a wire breakage signal indicating the breakage of wire to the serial communication buffer 73 when the wire breakage is detected.

The SW signal input buffer 72 monitors ON/OFF signal of the stop switch 29 and a signal indicating that the power is fed or not to the solenoids of the dual-position valves 21 to 24, 31 to 34 (for example, a voltage value applied on the solenoid) indicated in FIG. 1. Thereby, the ON/OFF signal indicating whether the brake pedal 27 is stepped on or not and the ON/OFF signal indicating whether the electric power is supplied to the solenoid or not can be outputted.

The serial communication buffer 73 converts a wire breakage signal from the wheel speed input buffer 71 and the ON/OFF signal from the SW signal input buffer 72 to the serial signal, and then transmits the serial signal to the microcomputer 60. A serial signal from the microcomputer 60 is then transmitted to this serial communication buffer 73.

The serial signal monitoring unit 74 monitors the microcomputer 60 based on the serial signal from the serial communication buffer 73. More specifically, the serial communication buffer 73 receives the result of arithmetic operation from the microcomputer 60 based on the signals from the wheel speed input buffer 71 and SW signal input buffer 72 to monitor whether this signal is normal or not. For example, when the signal indicating the ABS control condition is transmitted from the serial control unit 64 in spite that the OFF signal indicating that the stop switch 29 is not stepped on is transmitted from the SW signal input buffer 72, it is determined that the serial signal from the microcomputer 60 is not normal. When the serial signal from the microcomputer 60 is not normal, a reset signal is outputted to the reset control unit 77 described later or an inhibit signal is transmitted to the drive inhibit signal generating circuit 78.

The internal oscillator unit 75 forms an internal clock used in the serial signal monitoring unit 74 and the WD monitoring unit 76 or the like. In this internal oscillator unit 75, a plurality of clock signals are generated at different time points (timings) and the serial signal monitoring unit 74 and WD monitoring unit 76 select the clock, signal of appropriate timing as a monitor signal to realize a monitoring function.

The WD monitoring unit 76 monitors whether the arithmetic operation in the microcomputer 60 is performed normally or not based on the data such as arithmetic operation period produced from the microcomputer 60. For example, since the WD monitor signal is produced as a signal that is alternately inverted when the arithmetic operation is performed normally, if the WD monitor signal is not inverted alternately, it indicates that the arithmetic operation of the microcomputer 60 is not executed normally. When the arithmetic operation of the microcomputer 60 is not executed in the normal period, a reset signal is outputted to the reset control unit 77 described later or the inhibit signal is transmitted to the drive inhibit signal generating circuit 78.

At the time of initialization or when the reset signal is inputted to the reset control unit 77 from the serial signal monitoring unit 74 WD monitoring unit 76 and power supply monitoring unit 83 described later, the reset signal is transmitted to the microcomputer 60. Upon reception of this reset signal, the microcomputer 60 sets the values thereof to a mode of a predetermined reset condition. For example, the microcomputer 60 stops all arithmetic operations. Moreover, this reset signal is also transmitted to the serial communication buffer 73 and serial signal monitoring unit 74 for the purpose of initialization based on this reset signal.

The drive inhibit signal generating unit 78 transmits a solenoid drive inhibit signal and a motor drive inhibit signal to the relay drive unit 79 based on the inhibit signals from the serial signal monitoring unit 74, the WD monitoring unit 76, the excessive-heating protection circuit 81 and power supply monitoring unit 83 described later and also transmits directly the drive inhibit signal to a solenoid drive driver 90 without via the microcomputer 60. Therefore, when the solenoid drive inhibit signal is transmitted from the drive inhibit signal generating unit 78, the drive of solenoids is inhibited even when the microcomputer 60 is in operation.

The relay drive unit 79 controls switching of a semiconductor relay unit 100 and also controls power supply to the motor to drive the solenoids and; pumps 45a, 45b based on the solenoid drive signals and motor drive signal from the microcomputer 60. Moreover, when the solenoid drive inhibit signal and motor drive inhibit signal are inputted from the drive inhibit signal generating unit 78 and the output monitoring unit 92 of the solenoid driver 90, the relay drive unit 79 stops power supply to the solenoids and to the motor with the semiconductor relay unit 100.

The lamp drive unit 80 outputs under the normal condition the operating condition of the ABS control based on an ABS control condition signal from the microcomputer 60. However, it outputs a non-operating condition of the ABS control when the reset signal from the reset control unit 77 is inputted or when the solenoid drive inhibit signal and the motor drive inhibit signal are inputted from the drive inhibit signal generating unit 78. The lamp not illustrated lights up by receiving the signal from the lamp drive unit 80 to ensure the operating condition of the ABS control.

The excessive-heating protection circuit 81 detects that the chip has reached a predetermined temperature in order to prevent that the chip providing the peripheral IC 70 reaches the predetermined temperature. When the chip has reached the predetermined temperature, the drive inhibit signal generating unit 78 is caused to generate the inhibit signal and stop supply of voltage to the microcomputer 60 in view of preventing further temperature rise.

The power supply output circuit 82 corresponds to a monitored block and is connected to a power supply terminal (first power supply terminal) 101 and a ground terminal (first ground terminal) 103 connected to an external power supply allocated at the outside of the ECU 50. The power supply output circuit 82 outputs a predetermined voltage (for example, 5V, 3.3V) based on the voltage applied to the power supply terminal 101. An output voltage of the power supply output circuit 82 is used as a power supply voltage of the microcomputer 60, the peripheral IC 70 and the solenoid driver 90 or the like. Details of this power supply circuit 82 will be described later.

The power supply monitoring unit 83 corresponds to a monitor block and is connected to a power supply terminal (second power supply terminal) 105 other than the power supply terminal 101 connected with the power supply output circuit 82 and a ground terminal (second power supply terminal) 107. The power supply monitoring unit 83 monitors whether the output voltage of the power supply output circuit 82 is the predetermined value or not and also monitors whether the voltage, applied to the power supply output circuit 82 is an excessive voltage or not. For example, when the output voltage of the power supply output circuit 82 is less than the predetermined voltage, a reset signal is transmitted to the reset control unit 77. When it is higher than the predetermined value, an inhibit signal is transmitted to the drive inhibit signal generating unit 78. Moreover, the voltage applied to the power supply output circuit 82 is excessive, the inhibit signal is outputted to the drive inhibit signal generating unit 78 and supplying of voltage to the microcomputer 60 is stopped to prevent excessive-heating. Details of this power supply monitoring unit 83 will be described later.

The signal input/output buffer 84 is connected to a terminal 84a for checking for diagnosis when a car has a failure and makes communication with the microcomputer 60 by connecting a tester to the terminal 84a. Moreover, the signal input/output buffer 84 may be used as only an output buffer, for example, as a buffer which outputs the signal for indicating a vehicle speed displayed on a vehicle speed meter (for example, a signal corresponding to the estimated vehicle speed calculated from the wheel speed).

The temperature monitoring unit 85 always detects temperature of the ECU 50. The temperature monitoring unit 85 outputs the signal depending on the temperature of ECU 50 to the microcomputer 60 as a temperature detection signal. Based on this temperature detection signal, the microcomputer 60 performs the arithmetic operation for the ABS control depending on the detected temperature.

The solenoid driver 90 comprises MOS transistors 91 connected to the solenoids, output monitoring units 92 for monitoring voltage supply condition to the solenoids (MOS transistors 91) and AND circuits 93 for ON/OFF drive of the MOS transistors 91.

The MOS transistors 91 are connected to the respective solenoids of the various control valves 21 to 24, 31 to 34 illustrated in FIG. 1 to execute switching for voltage supply. basis to the solenoids to monitor a driver output to each solenoid. For example, it monitors the voltage supply condition to the solenoid based on the drain voltage and drain current of the MOS transistor 91. Thereby, for example, it is detected whether a drain current is excessive or not and whether a power supply wire to the solenoid is open or not or the current is leaking or not, and moreover whether the MOS transistor 91 is in the excessively high temperature or not. Thereby, if the result not suitable for driving the solenoid is attained, the output monitoring unit 92 transmits the solenoid drive inhibit signal and the motor drive inhibit signal to the relay drive unit 79 and also outputs the solenoid drive inhibit signal to the AND circuit 93.

To the AND circuit 93, an output signal of the microcomputer 60, an output signal from the relay drive unit 79, an output signal from the drive inhibit signal generating, unit 78 and an output signal from the output monitoring unit 92 are inputted. In the case of this embodiment, the output signals from the relay drive unit 79, the drive inhibit signal generating unit 78 and the output monitoring unit 92 are normally at low level. However, if any failure occurs, it turns to high level and the output of the AND circuit 93 becomes low, that is, the MOS transistor 91 turns off.

Thus, the solenoid driver 90 not only shuts off the power supply to the solenoid based on the signal from the microcomputer 60 and peripheral IC 70 but also shuts off the power supply to the solenoid based on the signal from the output monitoring unit 92 provided within the solenoid driver 90 itself.

In the semiconductor relay unit 100, the power supply to the solenoids is switched by a semiconductor relay 100a, while the power supply to the motor to drive the pumps 45a, 45b is switched by a semiconductor relay 100b. These semiconductor relays 100a, 100b are constructed to be controlled on the basis of the signal from the relay drive unit 79 to normally enable power supply to the solenoids and the motors and to disable the power supply to the solenoids and the motors upon reception of the solenoid drive inhibit signal and the motor drive inhibit signal from the relay drive unit 79.

The power supply output circuit 82 and power supply monitoring unit 83 of the ABS control ECU 50 will be described in more detail.

Figure 3:
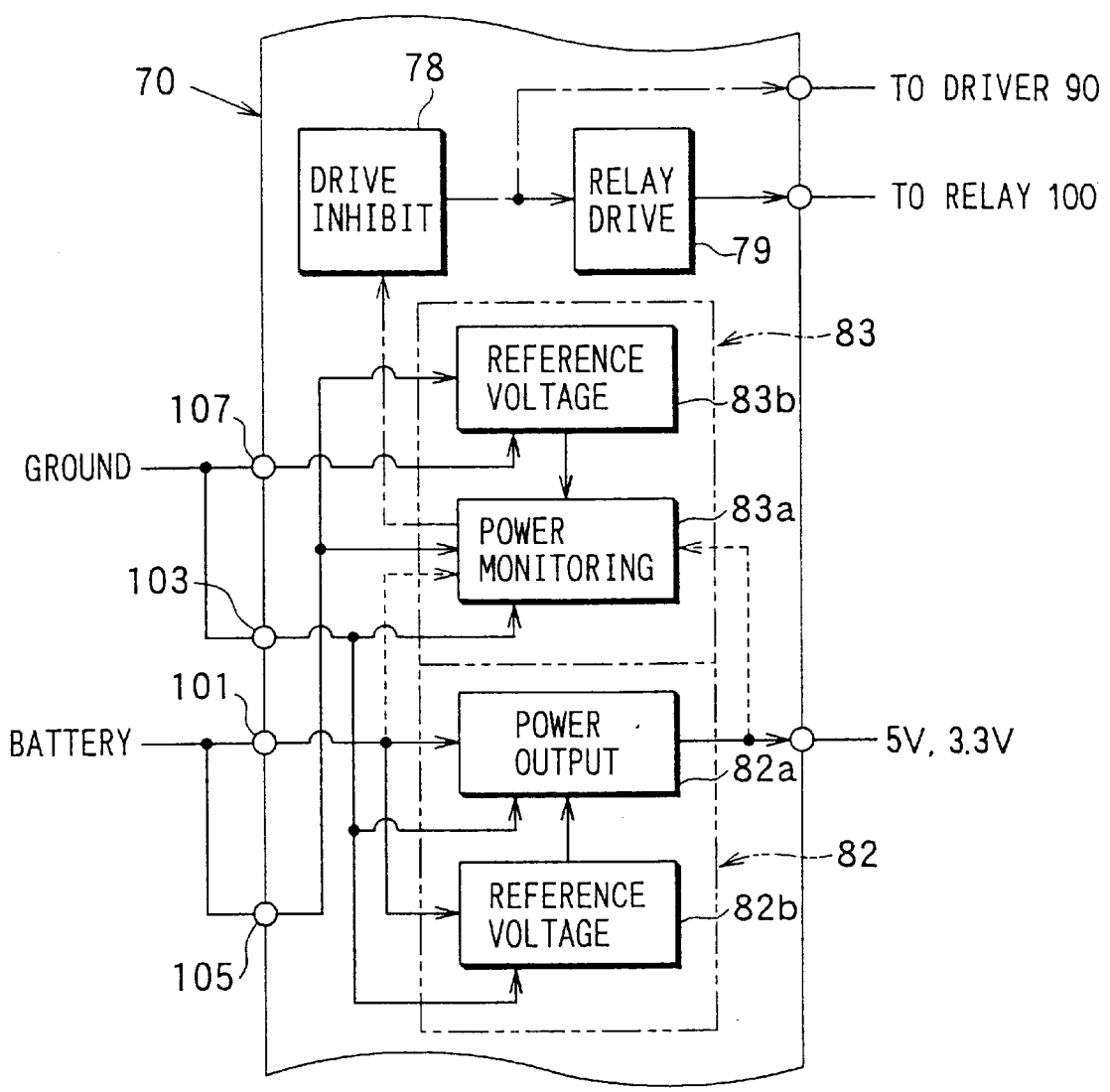
FIG. 3 is a block diagram illustrating a power output circuit and a power supply monitoring unit shown in FIG. 2.

As illustrated in FIG. 3, the power supply output circuit 82 has a circuit block (first circuit block) 82a and a reference voltage generating circuit (first reference, voltage generating circuit) 82b. The power supply monitoring unit 83 has a circuit block (second circuit block) 83a and a reference voltage generating circuit (second reference voltage generating circuit) 83b.

Both circuit block 82a and reference voltage generating circuit 82b of the power supply output circuit 82 are connected to the terminal 101 to which the battery voltage is applied. Both circuit block 83a and reference voltage generating circuit 83b of the power supply monitoring unit 83 are connected to the terminal 105 to which;the battery voltage is applied.

The reference voltage generating circuit 82b of the power supply output circuit 82 generates the reference voltage as a reference voltage of the output voltage. Moreover, the circuit block 82a generates the voltages, for example, 5V and 3.3V based on the reference voltage generated by the reference voltage generating circuit 82b to form the 5V power supply and 3.3V power supply as the power supply voltages of the microcomputer 60 and peripheral IC 70 or the like.

The reference voltage generating circuit 83b of the power supply monitoring unit 83 generates the reference voltage to set the reference of the monitoring voltage. For example, the circuit 83b generates the reference voltage which is slightly larger than the reference voltage generated by the reference voltage generating circuit 83b of the power supply output circuit 82. Moreover, the circuit block 83a generates a voltage larger than the voltage generated, for example, by the power supply output circuit 82 based on the reference voltage generated by the reference voltage generating circuit 83b.

The output voltage of the circuit block 82a is compared with the voltage generated by the circuit block 83a and when an output voltage of the power supply output circuit 82 is higher, for example, than the predetermined value, the circuit block 83a sends the inhibit signal to the drive inhibit signal generating unit 78.

Figure 4:
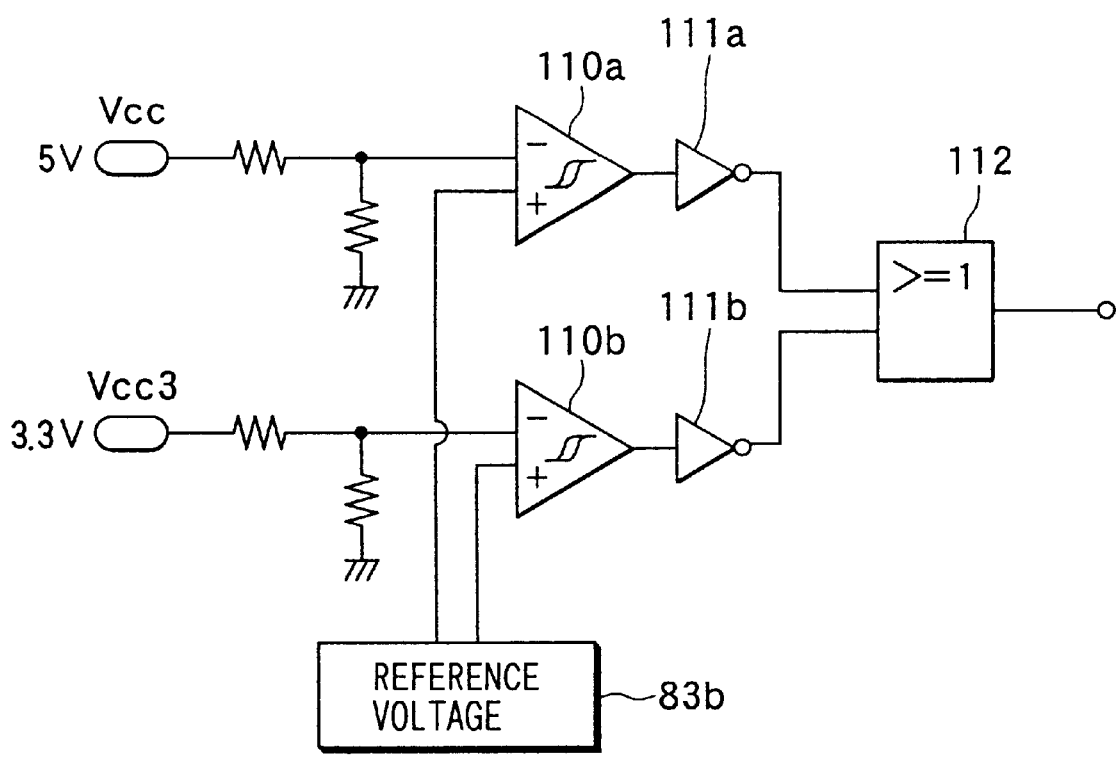
FIG. 4 is a circuit diagram illustrating a circuit block of the power supply monitoring unit shown in FIG. 3.

FIG. 4 shows the power supply monitoring unit 83 which executes the above operation. When the output voltage of the power supply output circuit 82 is higher than the predetermined value, the power supply monitoring unit 83 generates the inhibit signal.

For example, when the power supply output circuit 82 outputs 5V and 3.3V, the part for outputting 5V among the power supply output circuit 82 is connected to the Vcc terminal and the part for outputting 3.3V is connected to the Vcc3 terminal.

Thereby, the resistor division value of the Vcc terminal voltage, resistor division value of the Vcc3 terminal voltage and the reference voltage formed by the reference voltage generating circuit 83b are compared by comparators 110a, 11b and the comparison results are outputted via inverter circuits 111a, 111b and an OR circuit 112.

Therefore, when the resistor division value of the Vcc terminal voltage becomes higher than the reference voltage, high level signal is outputted; When the resistor division value of the Vcc3 terminal voltage becomes higher than the reference voltage, a high level signal is outputted. This high level signal can be outputted as the drive inhibit signal to the drive inhibit signal generating unit 78.

Here, the comparators 110a, 110b are provided with hysteresis functions and therefore a comparison voltage when an output of the comparators 110a, 110b is inverted to the low level from the high level is set to a different value from a comparison voltage when an output of the comparators 110a, 110b is inverted to the high level from the low level. For example, the comparison voltage when outputs of the comparators 110a, 110b are inverted to the low level from the high level is set to the voltage in the allowable range as the microcomputer drive power supply (for example, 6.7V, 4.3V). Alternatively, the comparison voltage when the outputs are inverted to the high level from the low level is set to the voltage for ensuring the operation of the microcomputer 60 (for example, 5.5V and 3.7V)

Subsequently, when the inhibit signal is transmitted to the drive inhibit signal generating unit 78, the solenoid drive inhibit signal and motor drive inhibit signal are outputted from the drive inhibit signal generating unit 78 as indicated with the chain line in FIG. 3. Thereby, the solenoid driver 79 turns off the MOS transistors 91. The relay drive circuit 79 outputs the solenoid drive inhibit signal and motor drive inhibit signal to inhibit power supply to the solenoids and motors via the semiconductor relay unit 100.

As explained above, the power supply terminal and ground (GND) terminal of the power supply output circuit 82 and those of the power supply monitoring unit 83 are formed in different structures. The power supply output circuit 82 and the power supply monitoring unit 83 respectively generate the reference voltages based on respective power supply voltages. Therefore, it can be prevented that a failure or an erroneous operation occurs due to an external electric noise or the like because of variation of the reference voltages in the same mode and tendency in both monitored block side and monitoring block side. As a result, the monitoring function can be assured.

Figure 5A:
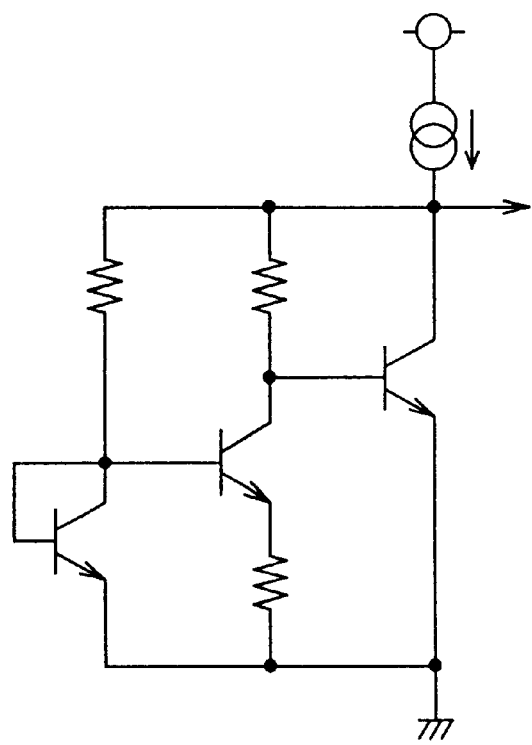
FIGS. 5A–5C are circuit diagrams illustrating reference voltage generating circuits shown in FIG. 3.
Figure 5B:
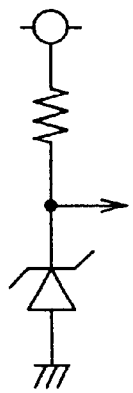
Figure 5C:
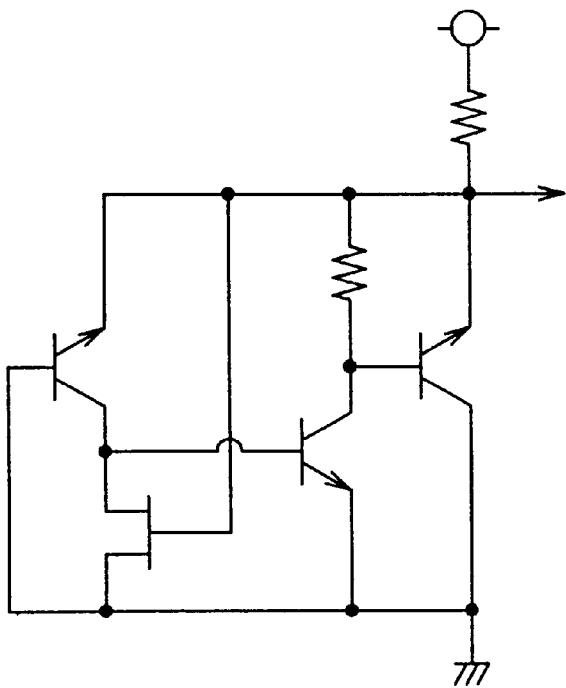

As the reference voltage generating circuits 82b and 83b illustrated in FIGS. 2 and 3, for example, a constant voltage generating circuit such as a band gap circuit illustrated in FIG. 5A, a Zener diode circuit illustrated in FIG. 5B and a punch-through circuit illustrated in FIG. 5C or the like may be employed.

In this case, it is preferable that the reference voltage generating circuit 82b and the reference voltage generating circuit 83b are formed of the constant voltage generating circuits of the other structures. It is because since the reference voltage generating circuit 82b and the reference voltage generating circuit 83b are formed on one chip, if the constant voltage generating circuits of the same structure are introduced, there arises a probability of occurrence of a failure due to the displacement of mask on the occasion of constituting the transistor or the like within the constant voltage generating circuit.

Moreover, although the power supply output circuit 82 and the power supply monitoring unit 83 are formed on one chip, it is preferable that these are electrically isolated as much as possible even on the same chip in order to prevent a failure or erroneous operation in the same mode and tendency.

For example, it is preferred that the power supply output circuit 82 and the power supply monitoring unit 83 are allocated in the spatially isolated positions even on the same chip. It is alternatively preferred that the power supply output circuit 82 and power supply monitoring unit 83 are formed on a substrate such as a SOI substrate having excellent insulation property and these are isolated for insulation by a trench or the like formed on the SOI substrate.

Moreover, it is also preferable that the power supply terminal connected with the power supply output circuit 82 and the ground terminal are isolated from the power supply terminal connected with the power supply monitoring unit 83 and the ground terminal in order to avoid simultaneous failure of both power supply output circuit 82 and the power supply monitoring unit 83 when ESD (electrostatic discharge) or the like is generated.

For example, when the ABS control ECU 50 is packaged as a controller unit, many terminals are provided. However, it is recommended that the power supply terminal 101 connected with the power supply output circuit 82 and the ground terminal 103 are not provided adjacently with the power supply terminal 105 connected with the power supply monitoring unit 83 and the ground terminal 107.

In above embodiment, the integrated circuit is applied to the ABS control ECU 50, but it can also be applied to other integrated circuits of other structures, for example, a side slip control ECU, a traction control ECU, a brake assisting control ECU or the like.

In addition, in above embodiment, the microcomputer 60, the peripheral IC 70, the solenoid driver 90 and the semiconductor relay unit 100 are constructed on different chips, but the present invention can also be applied even when any one of these units or all of these units are integrated on one chip.

What is claimed is:

1. An integrated circuit comprising
a monitoring block; and
a monitored block that is monitored by the monitoring block,
wherein the monitoring block and the monitored block are formed on one chip, and
wherein a first power supply terminal for supplying a first voltage to the monitored block and a second power supply terminal for supplying a second voltage to the monitoring block are provided as different terminals,
wherein the monitored block has a first reference voltage generating circuit which generates the first reference voltage on the basis of the first voltage supplied to the first power supply terminal;
the monitoring block has a second reference voltage generating circuit which generates the second reference voltage on the basis of the voltage supplied to the second power supply terminal;
the monitored block and the monitoring block are arranged as spatially separated blocks in the one chip; and
the monitored block and the monitoring block are insulated and isolated in the one chip.

2. The integrated circuit according to claim 1, wherein:
the integrated circuit is applied to an electronic control unit for a vehicle brake control system including;
a brake fluid pressure generating sources for generating brake fluid pressure,
wheel brake force generating means for respectively generating the brake force to each wheel by receiving the brake fluid pressure from the brake fluid pressure generating sources,
a piping provided between the brake fluid generating sources and the wheel brake force generating means; and
a plurality of control valves provided in the piping.

3. The integrated circuit according to claim 2, further comprising:
first switching means provided for ON/OFF control of a voltage supply to the plurality of control valves,
wherein the power supply monitoring block outputs a signal to the first switching means to turn off the voltage supply to the plurality of control valves, when the monitored block does not produce a required voltage.

4. The integrated circuit according to claim 3, further comprising:
second switching means provided for the ON/OFF control of voltage supply to pump driving motors provided in the piping,
wherein the monitoring block outputs a signal to the second switching means to turn off a voltage supply to the motors when the monitored block does not produce the required voltage.

5. The integrated circuit according to claim 2, further comprising:
a plurality of drivers provided to respectively drive the plurality of the control valves,
wherein the monitoring unit outputs a signal to the plurality of drivers to inhibit the drive of the plurality of the control valves when the monitored block does not produce a required voltage.

6. The integrated circuit according to claim 1, wherein:
the first reference voltage generating circuit of the monitored block is connected to the first power supply terminal; and
the first circuit block of the monitored block and the second circuit block and the second reference voltage generating circuit are connected to the second power supply terminal.

7. The integrated circuit according to claim 1, wherein:
the monitored block is a power output circuit for outputting a power supply voltage based on the reference voltage generated by the first reference voltage generating circuit; and
the monitoring block is a power supply monitoring unit for monitoring whether the power supply voltage outputted from the power output circuit is at a predetermined value or not based on the reference voltage generated by the second reference voltage generating circuit.

8. The integrated circuit according to claim 1, wherein:
a first ground terminal of the monitored block and a second ground terminal of the monitoring block are provided as different terminals.

9. The integrated circuit according to claim 1, wherein:
the first reference voltage generating circuit of the monitored block is connected to the first power supply terminal; and
the second reference voltage generating circuit of the monitoring block is connected to the second power supply terminal.

10. The integrated circuit according to claim 1, wherein:
the first circuit block and the first reference voltage generating circuit are connected to the first power supply terminal; and
the second circuit block and the second reference voltage generating circuit are connected to the second power supply terminal.

11. The integrated circuit according to claim 1, wherein:
the monitored block and the monitoring block are formed on a SOI substrate; and,
the monitored block and the monitoring block are insulated and isolated with a trench formed on the SOI substrate.

12. The integrated circuit according to claim 1, wherein:
the first reference voltage generating circuit and the second reference voltage generating circuit are formed in different circuit configurations from each other.

13. An integrated circuit for an electronic control unit of a vehicle having a battery comprising:
a control circuit for executing a control operation for a vehicle;
a power supply block having a first reference voltage generating circuit and a power supply circuit, the first reference voltage generating circuit being for generating a first reference voltage from a voltage of the battery, and the power supply circuit being operable with the first reference voltage to apply a control voltage to the control circuit; and
a monitoring block having a second reference voltage generating circuit and a power monitor circuit, the second reference voltage generating circuit being for generating a second reference voltage from the voltage of the battery, and the power monitor circuit being operable with the second reference voltage to monitor the control voltage applied by the power supply circuit to the control circuit,
wherein the power supply block and the monitored block are formed on one chip, and
wherein the power supply block and the monitoring block are spatially separated and electrically insulated from each other on the one chip.

14. The integrated circuit according to claim 13, further comprising:
a first power supply terminal for supplying the voltage of the battery to both the first reference voltage generating circuit and the power supply circuit; and
a second power supply terminal provided separately from the first power supply terminal for supplying the voltage of the battery to both the second reference voltage generating circuit and the monitoring circuit.

15. The integrated circuit according to claim 14, further comprising:
a first ground terminal for connecting the first reference voltage generating circuit, the power supply circuit and the power monitoring circuit to ground; and
a second ground terminal for connecting the second reference voltage to ground.

16. The integrated circuit according to claim 13, wherein:
the power supply block and the monitoring block are formed on a SOI substrate; and
the power supply block and the monitoring block are electrically insulated and isolated with a trench formed on the SOI substrate.

17. The integrated circuit according to claim 13, wherein:
the first reference voltage generating circuit and the second reference voltage generating circuit have different circuit configurations.

* * * * *